US012652002B2

(12) United States Patent
Xu et al.

(10) Patent No.: US 12,652,002 B2
(45) Date of Patent: Jun. 9, 2026

(54) BANDWIDTH ADJUSTMENT CIRCUIT AND BANDWIDTH ADJUSTMENT METHOD OF OPERATIONAL AMPLIFIER

(71) Applicant: SG MICRO CORP, Beijing (CN)

(72) Inventors: Jing Xu, Beijing (CN); Xiang Yu, Beijing (CN)

(73) Assignee: SG MICRO CORP, Beijing (CN)

( * ) Notice: Subject to any disclaimer, the term of this patent is extended or adjusted under 35 U.S.C. 154(b) by 455 days.

(21) Appl. No.: 18/255,443

(22) PCT Filed: Oct. 21, 2021

(86) PCT No.: PCT/CN2021/125338
§ 371 (c)(1),
(2) Date: Jun. 1, 2023

(87) PCT Pub. No.: WO2022/116729
PCT Pub. Date: Jun. 9, 2022

(65) Prior Publication Data
US 2024/0014783 A1     Jan. 11, 2024

(30) Foreign Application Priority Data
Dec. 2, 2020     (CN) .......................... 202011403237.6

(51) Int. Cl.
*H03F 1/02*         (2006.01)
*H03F 3/45*         (2006.01)

(52) U.S. Cl.
CPC ....... *H03F 1/0233* (2013.01); *H03F 3/45183* (2013.01); *H03F 3/45273* (2013.01); *H03F 3/45475* (2013.01)

(58) Field of Classification Search
CPC ...... H03F 1/0233; H03F 1/0272; H03F 1/486; H03F 1/42; H03F 3/45183;
(Continued)

(56) References Cited

U.S. PATENT DOCUMENTS

| | | | |
|---|---|---|---|
| 7,019,585 B1 | 3/2006 | Wilson et al. | |
| 10,775,823 B2 * | 9/2020 | Kotrc | G05F 1/565 |

(Continued)

FOREIGN PATENT DOCUMENTS

| | | |
|---|---|---|
| CN | 101295978 A | 10/2008 |
| CN | 104079246 A | 10/2014 |

(Continued)

OTHER PUBLICATIONS

International Search Report (including English translation) and Written Opinion for International Application No. PCT/CN2021/125338, dated Dec. 22, 2021, 8 pages.
(Continued)

*Primary Examiner* — Andrea Lindgren Baltzell
*Assistant Examiner* — Nareh Shamiryan
(74) *Attorney, Agent, or Firm* — Westman, Champlin & Koehler. P.A.

(57)         ABSTRACT

Disclosed is a bandwidth adjustment circuit and a bandwidth adjustment method of an operational amplifier. The circuit comprises: a bias current generation unit connected with a bias current input terminal of the operational amplifier and used for providing a bias current to the operational amplifier; a current adjustment unit, connected with the bias current generation unit and an output terminal of the operational amplifier, respectively, and used for adjusting the bias current according to an output voltage of the operational amplifier to realize bandwidth adjustment on the operational amplifier. The bandwidth adjustment circuit and the bandwidth adjustment method can dynamically adjust the bandwidth of the operational amplifier according to the output voltage, not only improving stability when the output voltage of the operational amplifier is low, but also ensuring excellent performance of the operational amplifier when the output voltage is high.

16 Claims, 3 Drawing Sheets

(58) Field of Classification Search
CPC .. H03F 3/45273; H03F 3/45475; H03F 3/165;
H03F 2200/36; H03F 2203/45244; Y02D
30/70
USPC ............... 330/297, 259, 261, 296, 273, 285
See application file for complete search history.

(56) References Cited

U.S. PATENT DOCUMENTS

| | | | |
|---|---|---|---|
| 2012/0013400 A1 | 1/2012 | Chang et al. | |
| 2013/0328631 A1 | 12/2013 | Hsu et al. | |
| 2019/0238093 A1* | 8/2019 | Hsieh ................... | H03B 5/1206 |
| 2025/0264896 A1* | 8/2025 | Lin ........................ | H10B 41/60 |

FOREIGN PATENT DOCUMENTS

| | | |
|---|---|---|
| CN | 104699161 A | 6/2015 |
| CN | 114584082 A | 6/2022 |
| CN | 115425930 A | 12/2022 |
| CN | 115549604 A | 12/2022 |
| KR | 20140079076 A | 6/2014 |

OTHER PUBLICATIONS

Office Action, including Search Report, for Chinese Patent Application No. 202011403237.6, dated Aug. 9, 2022, 14 pages.
Office Action, including Search Report, for Chinese Patent Application No. 202011403237.6, dated Oct. 8, 2022, 13 pages.

* cited by examiner

BANDWIDTH ADJUSTMENT CIRCUIT AND BANDWIDTH ADJUSTMENT METHOD OF OPERATIONAL AMPLIFIER

CROSS-REFERENCE TO RELATED APPLICATION

The present application is a Section 371 National Stage application of International Application No. PCT/CN2021/125338, filed on 21 Oct. 2021, which published as WO/2022/116729 A1, on Jun. 9, 2022, not in English, which claims priority to the Chinese patent application No. 202011403237.6, entitled "Bandwidth Adjustment Circuit and Bandwidth Adjustment Method of Operational Amplifier", filed on Dec. 2, 2020, the contents of which are incorporated herein by reference in their entireties.

FIELD OF THE DISCLOSURE

The present disclosure relates to a technical field of operational amplifiers, in particular to a bandwidth adjustment circuit and a bandwidth adjustment method of an operational amplifier.

DESCRIPTION OF THE RELATED ART

Operational Amplifier is a common kind of integrated circuit, and is widely used in applications such as analog signal operation, amplification, rectification and filtering. An operational amplifier is an indispensable component for signal processing. In many applications, an operational amplifier is required to have wide bandwidth and good stability.

For an operational amplifier according to the prior art, when an output voltage of the operational amplifier is low, the stability of the operational amplifier may be deteriorated. Usually, the stability of operational amplifier can be improved by reducing the bandwidth of the operational amplifier. A disadvantage is that the bandwidth of the operational amplifier does not change with the output voltage of the operational amplifier, so the bandwidth of the operational amplifier also becomes narrow when the output voltage of the operational amplifier is high, which ultimately affects performance of the operational amplifier.

Therefore, it is necessary to provide an improved technical scheme to overcome the above technical problems in the prior art.

SUMMARY

In order to solve technical problems as above, the present disclosure provides a bandwidth adjustment circuit and a bandwidth adjustment method of an operational amplifier, which can dynamically adjust a bandwidth of the operational amplifier according to an output voltage of the operational amplifier, thus improving stability when the output voltage of the operational amplifier is low and ensuring excellent performance of the operational amplifier when the output voltage is high.

According to an aspect of embodiments of the present disclosure, a bandwidth adjustment circuit of an operational amplifier is provided, and comprises: a bias current generation unit which is connected to a bias current input terminal of the operational amplifier and used for supplying a bias current to the operational amplifier;
    a current adjustment unit, which is connected to the bias current generation unit and an output terminal of the operational amplifier, respectively, and used for adjusting the bias current according to an output voltage of the operational amplifier to realize bandwidth adjustment on the operational amplifier.

Optionally, the bias current generation unit comprises:
    a first transistor and a second transistor forming a current mirror structure, wherein a source of the first transistor and a source of the second transistor are both connected to a power supply terminal, a gate and a drain of the first transistor are both connected to a gate of the second transistor, and a drain of the second transistor is connected to the bias current input terminal of the operational amplifier;
    a first current source, connected between the drain of the first transistor and a reference ground.

Optionally, a ratio between a width-to-length ratio of the first transistor and a width-to-length ratio of the second transistor is 1:1.

Optionally, both the first transistor and the second transistor are PMOS transistors.

Optionally, the current adjustment unit comprises:
    a third transistor and a fourth transistor forming a current mirror structure, wherein a drain of the third transistor is connected to the drain of the second transistor, a gate of the third transistor is connected to both of a gate and a drain of the fourth transistor, and a source of the third transistor and a source of the fourth transistor are connected to the reference ground;
    a fifth transistor, having a drain connected to the power supply terminal through a second current source, and having a source connected to the reference ground;
    a sixth transistor, having a gate connected to both of a gate and the drain of the fifth transistor, and having a source connected to the output terminal of the operational amplifier;
    a seventh transistor and an eighth transistor forming a current mirror structure, wherein a source of the seventh transistor and a source of the eighth transistor are both connected to the power supply terminal, a gate of the seventh transistor is connected to both of a gate and a drain of the eighth transistor, a drain of the seventh transistor is connected to the drain of the fourth transistor, and a drain of the eighth transistor is connected to a drain of the sixth transistor.

Optionally, a ratio between a width-to-length ratio of the third transistor and a width-to-length ratio of the fourth transistor is n:1;
    a ratio between a width-to-length ratio of the fifth transistor and a width-to-length ratio of the sixth transistor is 1:1;
    a ratio between a width-to-length ratio of the seventh transistor and a width-to-length ratio of the eighth transistor is 1:1, where n is a positive number.

Optionally, the third transistor, the fourth transistor, the fifth transistor and the sixth transistor are all NMOS transistors; the seventh transistor and the eighth transistor are both PMOS transistors.

According to another aspect of embodiments of the present disclosure, a bandwidth adjustment method of an operational amplifier is provided, and comprises following steps:
providing a bias current to the operational amplifier based on a current source;
    adjusting the bias current according to an output voltage of the operational amplifier, so as to realize bandwidth adjustment on the operational amplifier.

Optionally, step of providing the bias current to the operational amplifier based on the current source comprises:

generating a first mirror current on a second branch of a first current mirror circuit based on the current source arranged on a first current branch of the first current mirror circuit;

supplying the first mirror current to the operational amplifier.

Optionally, step of adjusting the bias current according to the output voltage of the operational amplifier comprises:

generating a first current on a first current branch of a second current mirror circuit;

shunting of the first mirror current according to the first current, so as to generate a second mirror current on a second current branch of the second current mirror circuit;

adjusting the first current according to the output voltage of the operational amplifier to adjust a current flow shunt from the first mirror current by the second mirror current according to the adjusted first current, so as to adjust the bias current, wherein the first mirror current is equal to a sum of the bias current and the second mirror current.

The present disclosure has following beneficial effects: the bandwidth adjustment circuit and the bandwidth adjustment method of the operational amplifier designed according to embodiments of the present disclosure can dynamically adjust the bias current provided to the operational amplifier according to the output voltage, thus realizing dynamic adjustment on the bandwidth of the operational amplifier according to the output voltage, which can not only reduce the bandwidth of the operational amplifier to improve the stability of the operational amplifier when the output voltage of the operational amplifier is low, but can also enhance or stabilize the bandwidth when the output voltage is high to ensure the excellent performance of the operational amplifier.

On the other hand, when constructing the bandwidth adjustment circuit, a combination of current mirror structures with several PMOS transistor pairs and several NMOS transistor pairs is adopted, so that the circuit structure can be simple, and the stability and anti-interference ability can be strong.

It should be noted that the above general description and the following detailed description are exemplary and explanatory only and are not intended to limit the present invention.

BRIEF DESCRIPTION OF THE DRAWINGS

The above and other objects, features and advantages of the present invention will become more apparent from the following description of embodiments of the present disclosure with reference to the accompanying drawings.

DETAILED DESCRIPTION OF EMBODIMENTS OF THE DISCLOSURE

Figure 1:
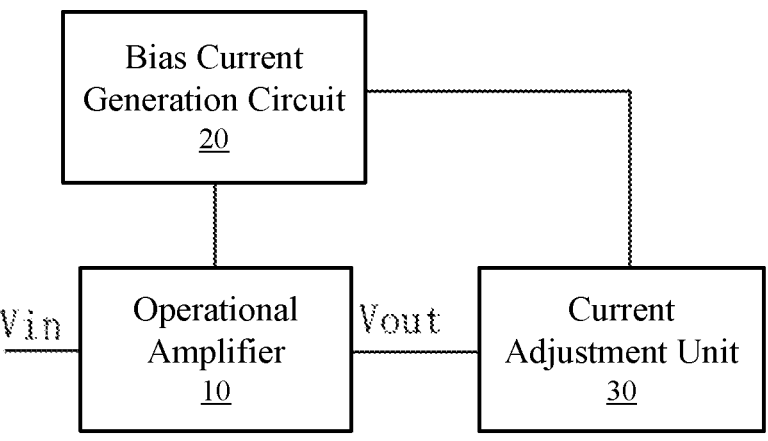
FIG. 1 shows a block structure diagram of a bandwidth adjustment circuit of an operational amplifier provided according to an embodiment of the present disclosure.

For making the present disclosure easily understood, a more complete description of the present disclosure is provided below with reference to the associated drawings. Some preferred embodiments of the present disclosure are shown in the drawings. However, the present disclosure may be implemented in different forms and is not limited to the embodiments described herein. These embodiments are provided for making the present disclosure more thoroughly and fully understood.

Unless otherwise defined, all technical and scientific terms used herein have the same meaning as would normally be understood by those skilled in the art of the present disclosure. Terms used herein in the specification of the present disclosure are for an objective to describe specific embodiments only and are not intended to limit the present invention.

Hereinafter, embodiments of the present disclosure will be described in detail with reference to the accompanying drawings.

Figure 2:
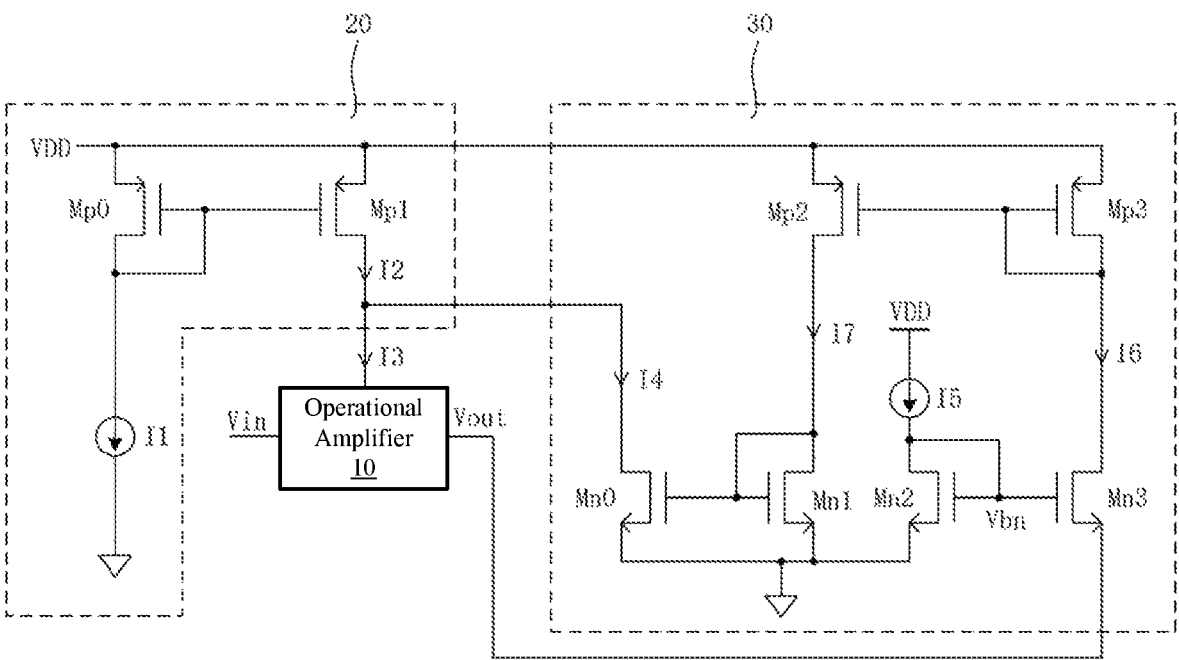
FIG. 2 shows a circuit structure schematic diagram of a bandwidth adjustment circuit of an operational amplifier provided according to an embodiment of the present disclosure.

FIG. 1 shows a block structure diagram of a bandwidth adjustment circuit of an operational amplifier provided according to an embodiment of the present disclosure, and FIG. 2 shows a circuit structure schematic diagram of a bandwidth adjustment circuit of an operational amplifier provided according to an embodiment of the present disclosure.

As shown in FIG. 1, in an embodiment of the present disclosure, the bandwidth adjustment circuit of the operational amplifier comprises a bias current generation circuit 20 and a current adjustment unit 30. The bias current generation circuit 20 is connected to a bias current input terminal of the operational amplifier 10 for supplying a bias current to the operational amplifier 10. The current adjustment unit 30 is connected to an output terminal of the operational amplifier 10 and the bias current generation unit 20, respectively, and is used for adjusting the bias current provided by the bias current generation unit 20 according to an output voltage Vout of the operational amplifier 10, so as to realize bandwidth adjustment on the operational amplifier 10.

Generally, the operational amplifier 10 is configured to generate the output voltage Vout at the output terminal according to an input voltage Vin received at an input terminal. In practical applications, there may be various specific connection configurations of the operational amplifier 10. It should be noted here that the bandwidth adjustment circuit of the operational amplifier in the present disclosure is applicable to different connection configurations of the operational amplifier 10.

As known, DC (direct current) operating point of the operational amplifier is provided according to the bias current. And the bandwidth of the operational amplifier is in direct proportion to the bias current provided to the operational amplifier, that is, the smaller the bias current provided to the operational amplifier, the narrower the bandwidth of the operational amplifier, which is beneficial to improve the stability of the operational amplifier; accordingly, the larger the bias current supplied to the operational amplifier, the wider the bandwidth of the operational amplifier. Therefore, according to embodiments of the present disclosure, by use of the current adjustment unit 30, the bias current supplied to the operational amplifier 10 by the bias current generation unit 20 can be dynamically adjusted according to the output voltage, thereby achieving an objective to adjust the bandwidth of the operational amplifier 10.

Referring to FIG. 2, in this embodiment, the bias current generation unit 20 includes a first transistor Mp0, a second transistor Mp1 and a first current source I1. The first transistor Mp0 and the second transistor Mp1 form a current mirror structure, a source of the first transistor Mp0 and a source of the second transistor Mp1 are both connected to a power supply terminal VDD, a gate and a drain of the first transistor Mp0 are both connected to a gate of the second transistor Mp1, and a drain of the second transistor Mp1 is connected to a bias current input terminal of the operational amplifier 10. The first current source I1 is connected between the drain of the first transistor Mp0 and a reference ground. The first transistor Mp0 and the second transistor Mp1 are both PMOS transistors.

Further, a ratio between a width-to-length ratio of the first transistor Mp0 and a width-to-length ratio of the second transistor Mp1 is 1:1. That is, in the first current mirror structure formed by the first transistor Mp0 and the second transistor Mp1, the current I1 on the branch where the first transistor Mp0 is arranged is same as the current I2 (an output current at the source of the second transistor Mp1) on the branch where the second transistor Mp1 is arranged, which is denoted as $I1=I2 \ldots$ (1).

Meanwhile, in this embodiment, the current adjustment unit 30 includes a third transistor Mn0, a fourth transistor Mn1, a fifth transistor Mn2, a sixth transistor Mn3, a seventh transistor Mp2, an eighth transistor MP3, and a second current source I5.

The third transistor Mn0 and the fourth transistor Mn1 form a current mirror structure, a drain of the third transistor Mn0 is connected to the drain of the second transistor Mp1, a gate of the third transistor Mn0 is connected to both of a gate and a drain of the fourth transistor Mn1, and a source of the third transistor Mn0 and a source of the fourth transistor Mn1 are both connected to the reference ground.

A drain of the fifth transistor Mn2 is connected to the power supply terminal VDD through the second current source I5, and a source of the fifth transistor Mn2 is connected to the reference ground. A gate of the sixth transistor Mn3 is connected to both of a gate and a drain of the fifth transistor Mn2, and a source of the sixth transistor Mn3 is connected to the output terminal of the operational amplifier 10.

The seventh transistor Mp2 and the eighth transistor Mp3 form a current mirror structure, a source of the seventh transistor Mp2 and a source of the eighth transistor Mp3 are both connected to the power supply terminal VDD, a gate of the seventh transistor Mp2 is connected to both of a gate and a drain of the eighth transistor Mp3, a drain of the seventh transistor Mp2 is connected to the drain of the fourth transistor Mn1, and a drain of the eighth transistor Mp3 is connected to the drain of the sixth transistor Mn3. The third transistor Mn0, the fourth transistor Mn1, the fifth transistor Mn2, and the sixth transistor Mn3 are all NMOS transistors. The seventh transistor Mp2 and the eighth transistor Mp3 are both PMOS transistors.

Further, a ratio between a width-to-length ratio of the third transistor Mn0 and a width-to-length ratio of the fourth transistor Mn1 is n:1, where and n is a positive number. A ratio between a width-to-length ratio of the fifth transistor Mn2 and a width-to-length ratio of the sixth transistor Mn3 is 1:1. A ratio between a width-to-length ratio of the seventh transistor Mp2 and a width-to-length ratio of the eighth transistor Mp3 is 1:1. In the present disclosure, a drain current of the third transistor Mn0 is denoted as I4, a drain current of the fourth transistor Mn1 which is also a drain current of the eighth transistor Mp3 is denoted as I7, and a drain current of the sixth transistor Mn3 which is also a drain current of the seventh transistor Mp2 is denoted as I6. And then there will be, $I4=n \cdot I7=n \cdot I6 \ldots$ (2).

Meanwhile, if the bias current received by the operational amplifier 10 is denoted as I3, then based on a connection relationship among the second transistor Mp1, the third transistor Mn0 and the bias current input terminal of the operational amplifier 10, there will be $I2=I3+I4 \ldots$ (3).

Based on Formulas (1), (2) and (3), it can be known that $I3=I1-n \cdot I6 \ldots$ (4).

Referring to FIG. 2, based on the connection relationship between the fifth transistor Mn2 and the sixth transistor Mn3, it can be known that when the output voltage Vout of the operational amplifier 10 is 0V, the fifth transistor Mn2 and the sixth transistor Mn3 form a current mirror structure, and at this time there will be $I5=I6 \ldots$ (5). As the output voltage Vout of the operational amplifier 10 gradually increases, the current I6 may gradually decreases, and when the gate-source voltage Vgs_Mn3 of the sixth transistor Mn3 is Vgs_Mn3=Vbn−Vout and is less than its turn-on threshold voltage Vthn, the sixth transistor Mn3 is turned off, and has a drain current I6=0, i.e., as shown by the voltage-current curve in FIG. 3, which is a schematic diagram showing a relationship between the output voltage of the operational amplifier in FIG. 2 and the drain current of the sixth transistor, where Vbn denotes a gate voltage of the sixth transistor Mn3.

Figure 3:
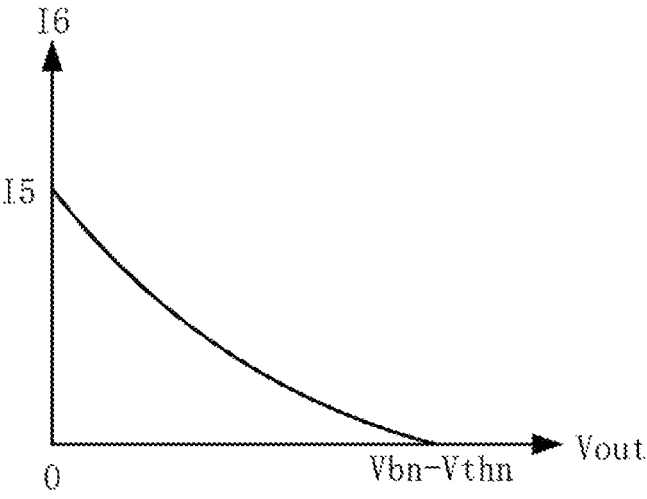
FIG. 3 is a schematic diagram showing a relationship between the output voltage of the operational amplifier in FIG. 2 and a drain current of the sixth transistor.
Figure 4:
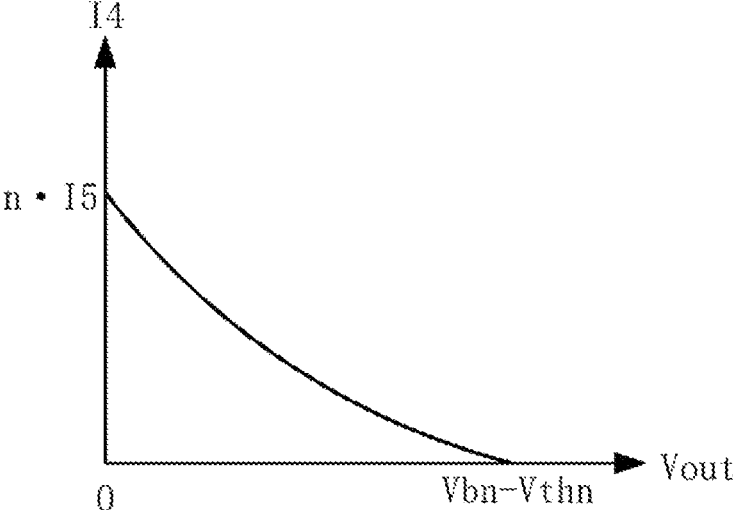
FIG. 4 is a schematic diagram showing a relationship between the output voltage of the operational amplifier in FIG. 2 and a drain current of the third transistor.

In combination with the relationship shown in FIG. 3 and Formula (2) and Formula (5), the voltage-current relationship shown in FIG. 4, which shows a schematic diagram of a relationship between the output voltage of the operational amplifier in FIG. 2 and the drain current of the third transistor, can be obtained.

Figure 5:
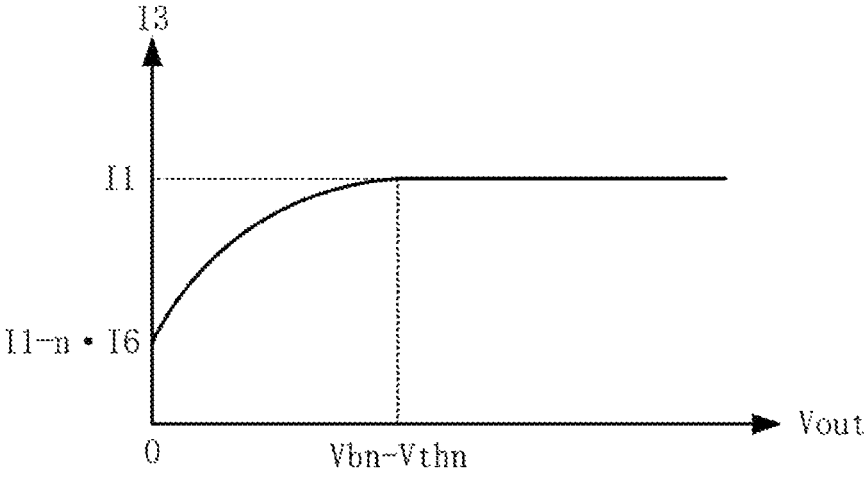
FIG. 5 shows a schematic diagram showing a relationship between the output voltage and a bias current of the operational amplifier in FIG. 2.

In further combination with the relationship shown in FIG. 4 and Formula (4), the voltage-current relationship shown in FIG. 5, which shows the schematic diagram of a relationship between the output voltage and the bias current of the operational amplifier in FIG. 2, can be obtained.

It can be concluded from FIG. 5 that when the output voltage Vout of the operational amplifier 10 is greater than 0V and less than Vbn−Vthn, the bias current I3 is smaller than the current I1 of the first current source, and during this period, if the output voltage Vout gradually decreases, the bias current I3 also decreases with the output voltage Vout. When the output voltage Vout of the operational amplifier 10 is reduced to 0V, the bias current I3 received by the operational amplifier 10 may reach its minimum, and $I3=I1-n \cdot I6=I1-n \cdot I5$, so at this time the bandwidth of the operational amplifier 10 is the narrowest, and narrowing the bandwidth of the operational amplifier 10 is beneficial to improving the stability of the operational amplifier 10. Similarly, during this period, if the output voltage Vout gradually increases, the bias current I3 also increases with the output voltage Vout, and then the bandwidth of the operational amplifier 10 can be gradually widen. When the output voltage Vout of the operational amplifier 10 is greater than Vbn−Vthn, the bias current I3 tends to be stable and is nearly equal to the current I1 of the first current source. Therefore, at this time, since the bias current I3 received by the operational amplifier 10 is unchanged, the bandwidth of the operational amplifier can also change and finally become a wide bandwidth, thus ensuring excellent performance of the operational amplifier 10.

Based on the above description, the bandwidth adjustment circuit of the operational amplifier disclosed according to embodiments of the present disclosure can finally realize an objective to dynamically adjust the bandwidth of the operational amplifier according to the output voltage of the operational amplifier, thereby enabling the operational amplifier to be operated with a narrow bandwidth when the output voltage is low, which can enhance circuit stability when the output voltage of the operational amplifier is low, and to be operated with a wide bandwidth when the output voltage is high, which can ensure excellent performance of the operational amplifier.

Figure 6:
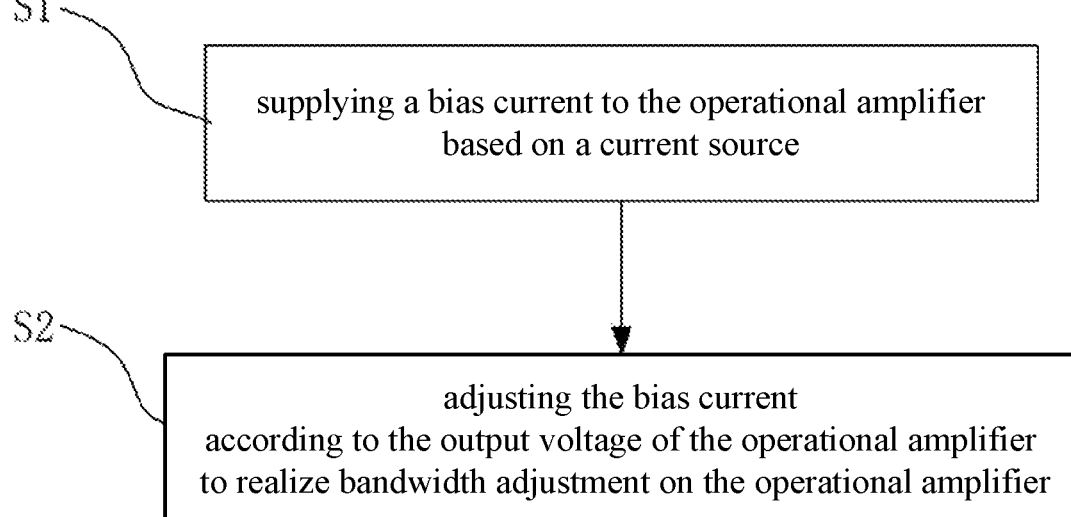
FIG. 6 shows a flowchart diagram of a bandwidth adjustment method of an operational amplifier provided according to an embodiment of the present disclosure.

FIG. 6 shows a flowchart diagram of a bandwidth adjustment method of an operational amplifier provided according to an embodiment of the present disclosure.

As shown in FIG. 6, in an embodiment of the present disclosure, the bandwidth adjustment method of the operational amplifier includes executing steps S1 and S2.

In step S1, a bias current is supplied to the operational amplifier based on a current source.

In the embodiment, the step of supplying the bias current to the operational amplifier based on the current source comprises: generating a first mirror current on a second current branch of a first current mirror circuit based on the current source which is arranged on a first current branch of the first current mirror circuit; supplying the first mirror current to the operational amplifier.

Referring to FIG. 2, the first current mirror circuit includes a first transistor Mp0 and a second transistor Mp1. The first current branch of the first current mirror circuit is a branch where the first transistor Mp0 is arranged, and the second current branch of the first current mirror circuit is a branch where the second transistor Mp1 is arranged. The current source arranged on the first current branch of the first current mirror circuit is the first current source I1. The first mirror current is the drain current I2 of the second transistor Mp1.

In step S2, the bias current is adjusted according to the output voltage of the operational amplifier to realize bandwidth adjustment on the operational amplifier.

In the embodiment, the step of adjusting the bias current according to the output voltage of the operational amplifier comprises: generating a first current on a first current branch of a second current mirror circuit; generating a second mirror current on a second current branch of the second current mirror circuit by shunting of the first mirror current according to the first current; adjusting the first current according to the output voltage of the operational amplifier to adjust the second mirror current which is shunt from the first mirror current according to the adjusted first current, so as to adjust the bias current, wherein the first mirror current is equal to a sum of the bias current and the second mirror current.

Referring to FIG. 2, the second current mirror circuit includes a third transistor Mn0, a fourth transistor Mn1, a fifth transistor Mn2, a sixth transistor Mn3, a seventh transistor Mp2, an eighth transistor MP3 and a second current source I5. The first current branch of the second current mirror circuit is a branch where the sixth transistor Mn3 and the seventh transistor Mp2 are arranged. The second current branch of the second current mirror circuit is a branch where the third transistor Mn0 is arranged. The first current is the drain current of the sixth transistor Mn3, and the second mirror current is the drain current of the third transistor Mn0.

Based on an understanding of FIG. 2, it can be known that when the output voltage Vout of the operational amplifier 10 is 0V, the first current reaches its maximum, and the current flow shunt by the second mirror current from the first mirror current reaches its maximum, and the remained flow (i.e., the bias current I3 which is actually supplied to the operational amplifier 10) that is not shunt by the second mirror current from the first mirror current reaches its minimum. When the output voltage Vout of the operational amplifier 10 changes, the first current correspondingly changes, and the current flow shunt by the second mirror current from the first mirror current can also change, so that the remained flow (i.e., the bias current I3 which is actually supplied to the operational amplifier 10) that is not shunt by the second mirror current from the first mirror current can be adjusted accordingly, thus adjusting the bandwidth of the operational amplifier 10 with the output voltage.

To sum up, the bandwidth adjustment circuit and the bandwidth adjustment method of the operational amplifier designed according to embodiments of the present disclosure can dynamically adjust the bias current provided to the operational amplifier according to the output voltage, thus realizing dynamic adjustment on the bandwidth of the operational amplifier according to the output voltage, which can not only reduce the bandwidth of the operational amplifier to improve the stability of the operational amplifier when the output voltage of the operational amplifier is low, but can also enhance or stabilize the bandwidth when the output voltage is high to ensure the excellent performance of the operational amplifier.

On the other hand, when constructing the bandwidth adjustment circuit, a combination of current mirror structures with several PMOS transistor pairs and several NMOS transistor pairs is adopted, so that the circuit structure can be simple, and the stability and anti-interference ability can be strong.

It should be noted that, in the present disclosure, terms "including", "comprising" or any other variation thereof are intended to encompass non-exclusive inclusion, so that a process, method, article or equipment including a set of elements, may not only include those elements, but may also include other elements that are not explicitly listed, or may further include elements inherent to such process, method, article or equipment. In the absence of more limitations, an element limited by a statement "comprises a . . . " does not preclude an existence of another identical element in the process, method, article or equipment including said element.

Finally, it should be noted that, it is obvious that the embodiments in accordance with the present disclosure are described above, and these embodiments neither exhaustively describe all the details nor limit the present disclosure to only specific embodiments. Other variations or modifications in different forms may be made on the basis of the above description for those of ordinary skill in the art. Providing an exhaustive list of all embodiments here is not necessary and is also impossible. However, obvious variations or modifications derived therefrom are still within the protection scope of the present disclosure.

What is claimed is:

1. A bandwidth adjustment circuit of an operational amplifier, comprising:

a bias current generation unit, which is connected to a bias current input terminal of the operational amplifier and used for supplying a bias current to the operational amplifier;

a current adjustment unit, which is connected to the bias current generation unit and an output terminal of the operational amplifier, respectively, and used for adjusting the bias current according to an output voltage of the operational amplifier to realize bandwidth adjustment on the operational amplifier, wherein the current adjustment unit comprises an adjusting transistor, which is serially connected between the output terminal of the operational amplifier for providing the output voltage and a power supply terminal, to allow a first current flowing through the adjusting transistor to be adjusted according to the output voltage of the operational amplifier, wherein the current adjustment unit is configured to adjust the bias current by shunting a current flow off from the bias current, the current flow is adjusted in accordance with the first current flowing through the adjusting transistor.

2. The bandwidth adjustment circuit according to claim 1, wherein the bias current generation unit comprises:

a first transistor and a second transistor forming a current mirror structure, wherein a source of the first transistor and a source of the second transistor are both connected to the power supply terminal, a gate and a drain of the first transistor are both connected to a gate of the second transistor, and a drain of the second transistor is connected to the bias current input terminal of the operational amplifier;

a first current source, connected between the drain of the first transistor and a reference ground.

3. The bandwidth adjustment circuit according to claim 2, wherein a ratio between a width-to-length ratio of the first transistor and a width-to-length ratio of the second transistor is 1:1.

4. The bandwidth adjustment circuit according to claim 3, wherein the first transistor and the second transistor are both PMOS transistors.

5. The bandwidth adjustment circuit according to claim 1, wherein the current adjustment unit comprises:

a third transistor and a fourth transistor forming a current mirror structure, wherein a drain of the third transistor is connected to the bias current input terminal of the operational amplifier, a gate of the third transistor is connected to both of a gate and a drain of the fourth transistor, and a source of the third transistor and a source of the fourth transistor is connected to a reference ground;

a fifth transistor, which has a drain connected to the power supply terminal through a second current source, and has a source connected to the reference ground;

a sixth transistor serving as the adjusting transistor, which has a gate connected to both of a gate and the drain of the fifth transistor and has a source connected to the output terminal of the operational amplifier;

a seventh transistor and an eighth transistor forming a current mirror structure, wherein a source of the seventh transistor and a source of the eighth transistor are both connected to the power supply terminal, a gate electrode of the seventh transistor is connected to both of a gate and a drain electrode of the eighth transistor, a drain of the seventh transistor is connected to the drain electrode of the fourth transistor, and a drain of the eighth transistor is connected to a drain electrode of the sixth transistor.

6. The bandwidth adjustment circuit according to claim 5, wherein a ratio between a width-to-length ratio of the third transistor and a width-to-length ratio of the fourth transistor is n:1;

a ratio between a width-to-length ratio of the fifth transistor and a width-to-length ratio of the sixth transistor is 1:1;

a ratio between a width-to-length ratio of the seventh transistor and a width-to-length ratio of the eighth transistor is 1:1, where n is a positive number.

7. The bandwidth adjustment circuit according to claim 6, wherein the third transistor, the fourth transistor, the fifth transistor and the sixth transistor are all NMOS transistors;

the seventh transistor and the eighth transistor are both PMOS transistors.

8. A bandwidth adjustment method of an operational amplifier, comprising:

providing a bias current to the operational amplifier based on a current source;

adjusting the bias current according to an output voltage of the operational amplifier, so as to realize bandwidth adjustment on the operational amplifier, wherein adjusting the bias current according to an output voltage of the operational amplifier comprises:

adjusting a first current flowing through an adjusting transistor according to the output voltage of the operational amplifier, wherein the adjusting transistor is serially connected between an output terminal of the operational amplifier for providing the output voltage and a power supply terminal; and adjust the bias current by shunting a current flow off from the bias current, wherein the current flow is adjusted in accordance with the first current flowing through the adjusting transistor.

9. The bandwidth adjustment method according to claim 8, wherein step of providing the bias current to the operational amplifier based on the current source comprises:

generating a first mirror current on a second branch of a first current mirror circuit based on the current source arranged on a first current branch of the first current mirror circuit;

supplying the first mirror current to a bias current input terminal of the operational amplifier, wherein the current flow is shunt off at the bias current input terminal.

10. The bandwidth adjustment method according to claim 9, wherein the first current is generated on a first current branch of a second current mirror circuit comprising the adjusted transistor and a second mirror current, serving as the current flow, is provided on a second current branch of the second current mirror circuit;

wherein, the first mirror current is equal to a sum of the bias current and the second mirror current.

11. A bandwidth adjustment circuit of an operational amplifier, comprising:

a bias current generation unit, which is connected to a bias current input terminal of the operational amplifier and used for supplying a bias current to the operational amplifier;

a current adjustment unit, which is connected to the bias current generation unit and an output terminal of the operational amplifier, respectively, and used for adjusting the bias current according to an output voltage of the operational amplifier to realize bandwidth adjustment on the operational amplifier, wherein the current adjustment unit comprises:

a third transistor and a fourth transistor forming a current mirror structure, wherein a drain of the third transistor is connected to the bias current input terminal of the operational amplifier, a gate of the third transistor is connected to both of a gate and a drain of the fourth transistor, and a source of the third transistor and a source of the fourth transistor is connected to a reference ground;

a fifth transistor, which has a drain connected to a power supply terminal through a second current source, and has a source connected to the reference ground;

a sixth transistor, which has a gate connected to both of a gate and the drain of the fifth transistor and has a source connected to the output terminal of the operational amplifier;

a seventh transistor and an eighth transistor forming a current mirror structure, wherein a source of the seventh transistor and a source of the eighth transistor are both connected to the power supply terminal, a gate electrode of the seventh transistor is connected to both of a gate and a drain electrode of the eighth transistor, a drain of the seventh transistor is connected to the drain electrode of the fourth transistor, and a drain of the eighth transistor is connected to a drain electrode of the sixth transistor.

12. The bandwidth adjustment circuit according to claim 11, wherein the bias current generation unit comprises:

a first transistor and a second transistor forming a current mirror structure, wherein a source of the first transistor and a source of the second transistor are both connected to the power supply terminal, a gate and a drain of the first transistor are both connected to a gate of the second transistor, and a drain of the second transistor is connected to the bias current input terminal of the operational amplifier;

a first current source, connected between the drain of the first transistor and a reference ground.

13. The bandwidth adjustment circuit according to claim 12, wherein a ratio between a width-to-length ratio of the first transistor and a width-to-length ratio of the second transistor is 1:1.

14. The bandwidth adjustment circuit according to claim 11, wherein the first transistor and the second transistor are both PMOS transistors.

15. The bandwidth adjustment circuit according to claim 11, wherein a ratio between a width-to-length ratio of the third transistor and a width-to-length ratio of the fourth transistor is n:1;

a ratio between a width-to-length ratio of the fifth transistor and a width-to-length ratio of the sixth transistor is 1:1;

a ratio between a width-to-length ratio of the seventh transistor and a width-to-length ratio of the eighth transistor is 1:1, where n is a positive number.

16. The bandwidth adjustment circuit according to claim 11, wherein the third transistor, the fourth transistor, the fifth transistor and the sixth transistor are all NMOS transistors; the seventh transistor and the eighth transistor are both PMOS transistors.

* * * * *